United States Patent [19]
Yoshida et al.

[11] Patent Number: 6,052,893
[45] Date of Patent: Apr. 25, 2000

[54] PROCESS FOR MANUFACTURING A RESIN-ENCAPSULATED ELECTRONIC PRODUCT

[75] Inventors: Koichi Yoshida, HigashiOsaka; Tetsuo Fukushima, Katano; Kenichiro Suetsugu, Nishinomiya, all of Japan

[73] Assignee: Matsushita Electric Industrial Co., Ltd., Osaka, Japan

[21] Appl. No.: 09/077,670

[22] PCT Filed: Dec. 6, 1996

[86] PCT No.: PCT/JP96/03578

§ 371 Date: Jun. 3, 1998

§ 102(e) Date: Jun. 3, 1998

[87] PCT Pub. No.: WO97/20673

PCT Pub. Date: Jun. 12, 1997

[30] Foreign Application Priority Data

Dec. 7, 1995 [JP] Japan .................................. 7-318963

[51] Int. Cl.[7] .................................................. A05K 3/30
[52] U.S. Cl. ............................. 29/841; 29/832; 29/592.1; 29/593
[58] Field of Search ............................. 29/840, 846, 830, 29/593, 592.1, 832

[56] References Cited

U.S. PATENT DOCUMENTS

| | | |
|---|---|---|
| 4,001,655 | 1/1977 | Voyles et al. . |
| 4,686,764 | 8/1987 | Adams et al. ........................ 29/592.1 |
| 4,784,872 | 11/1988 | Moeller et al. . |
| 4,803,543 | 2/1989 | Inayoshi et al. . |
| 4,942,140 | 7/1990 | Ootsuki et al. . |
| 4,993,265 | 2/1991 | Koen et al. ........................... 29/593 X |
| 5,064,895 | 11/1991 | Köhler et al. . |
| 5,219,795 | 6/1993 | Kumai et al. ............................ 29/841 |

FOREIGN PATENT DOCUMENTS

| | | |
|---|---|---|
| 389903 | 10/1990 | European Pat. Off. . |
| 61-67246 | 4/1986 | Japan . |
| 61-222239 | 10/1986 | Japan . |
| 2-237139 | 9/1990 | Japan . |
| 3-22588 | 1/1991 | Japan ....................................... 29/832 |
| 6-53554 | 2/1994 | Japan . |
| 6-198669 | 7/1994 | Japan . |

OTHER PUBLICATIONS

Xydar Liquid Crystal Polymers (1998) p. 4.
Toray Dow Corning Silcone with Translation (1994) 4 pg.

*Primary Examiner*—Carl J. Arbes
*Attorney, Agent, or Firm*—Price, Gess & Ubell

[57] ABSTRACT

The present invention provides a method of manufacturing a small electronic component, by which its yield can be enhanced. The invention comprises the steps of: a component mounting step of mounting a necessary electronic component 2–4 on a substrate 1; a coating layer forming step of forming a coating layer 14 for covering and sealing the substrate 1 in its entirety including the electronic component 2–4 with a coating material having high heat resistance; and a package layer forming step of forming a package layer 17 for covering and sealing a circumference of the coating layer 14 with a thermoplastic resin material 12. In the package layer forming step, adverse effects by the heat from the thermoplastic resin 12 to the electronic components 2–4 and the substrate 1 are inhibited with the coating layer 14.

6 Claims, 2 Drawing Sheets

PROCESS FOR MANUFACTURING A RESIN-ENCAPSULATED ELECTRONIC PRODUCT

TECHNICAL FIELD

The present invention relates to a method for manufacturing a resin-encapsulated electronic product which consists of a substrate on which required electronic components are mounted and are entirely sealed in a resin for packaging.

BACKGROUND ART

A resin-encapsulated electronic product is generally manufactured through such processes as described below. Specifically, as shown in FIG. 2A, the product is assembled such that a double-side printed circuit substrate 1, on both sides of which predetermined printed patterns are formed, is mounted with necessary electronic components 2–4 by soldering and is connected with lead elements 7 at its both ends, so as to have certain required functions, for example, as a gas meter or other appliances. Next, as shown in FIG. 2B, the entire printed circuit substrate 1 including the electronic components 2–4 is inserted into a cavity 10 formed by a lower mold 8 and an upper mold 9, after which both molds 8, 9 are clamped together. Successively, a thermoplastic resin material 12 which has been heated at a high temperature and thus melted is injected into the cavity 10 through an injection orifice 11. After the thermoplastic resin 12 has been set by being cooled, the molds 8, 9 are removed, resulting in a resin-encapsulated electronic product 13 which is covered with a package layer 17 of the thermoplastic resin 12 and thereby protected from an outer atmosphere as shown in FIG. 2C.

However, the above-described conventional manufacturing method has such a drawback that when the thermoplastic resin 12 is injected into the cavity 10 from the orifice 11, the heated and melted resin 12 tends to cause various defects: for example the electronic components 2–4 may be damaged by heat; a part of solder paste which connects the electronic components 2–4 on the substrate 1 may melt and flow away; or electronic components may be shoved and thus displaced from a certain mounting position. There has been a problem of decrease in the yield of such resin-encapsulated electronic products 13 due to these defects.

DISCLOSURE OF INVENTION

An object of the present invention is to provide a manufacturing method of small electronic components, by which a decline in the yield is prevented.

To accomplish the above said object, the method for manufacturing a resin-encapsulated electronic product according to the present invention comprises the steps of: a component mounting step of mounting a necessary electronic component on a substrate; a coating layer forming step of forming a coating layer for covering and sealing the substrate in its entirety including the electronic component with a coating material having high heat resistance; and a package layer forming step of forming a package layer for covering and sealing a circumference of the coating layer with a thermoplastic resin material.

According to the manufacturing method of the present invention, in the package layer forming step, the electronic component, the printed circuit substrate, and the solder paste are all protected by the coating layer which has a distinct heat-resisting property and are thereby prevented from being directly contacted with the melted thermoplastic resin. Accordingly, the electronic components are prevented from being damaged by heat, since the heat stress exerted thereto is alleviated due to the coating layer which blocks the heat conductance from the thermoplastic resin. Also, the shearing strain which is exerted on the electronic components and the solder paste from the inflow of the thermoplastic resin is remarkably reduced as compared with the case in which they are not covered with the coating layer because they are fixed by the coating layer. Thus, it is avoided that the electronic components are displaced or a part of the solder paste melts and flows away. Accordingly, highly favorable sealing in terms of functions and reliability can be achieved with the package layer of the thermoplastic resin, and the yield of the finished resin-encapsulated electronic product is remarkably enhanced.

Also, in the above invention, it is favorable to use silicone and crystal polymer respectively as the coating material and the thermoplastic resin material.

Since silicon has a high heat-resisting property, it can certainly protect the electronic components and the substrate from the heat from the thermoplastic resin which has been melted at a high temperature in the package layer forming step. Further, silicon has also a favorable electric insulating function because of its excellent dielectric characteristic, anti-partial discharge characteristic, and arc resisting characteristic. On the other hand, crystal polymer has a high molding characteristic, by which a favorable package layer can be formed.

BEST MODES FOR CARRYING OUT THE INVENTION

Figure 1A:
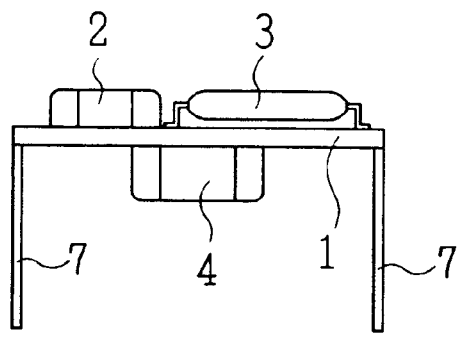
FIGS. 1A–1D are simplified cross-sectional views showing a manufacturing method in order of process according to one embodiment of the present invention, respectively illustrating a mounting step (FIG. 1A), a coating layer forming step (FIG. 1B), a package layer forming step (FIG. 1C), and a finished resin-encapsulated electronic product (FIG. 1D)

Preferred embodiments of the present invention will be hereinafter described referring to the drawings. FIGS. 1A–1D show a manufacturing method according to one embodiment of the present invention in order of processing steps.

First, as shown in FIG. 1A, a double-side printed circuit substrate 1, on both sides of which predetermined printed patterns are formed, is mounted with necessary electronic components 2–4 by soldering, and connected with lead elements 7 at its both ends, so as to be assembled to have certain required functions, for example, as a gas meter or other appliances.

Figure 1B:
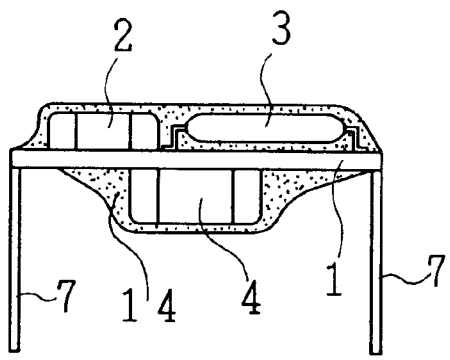

Next, as shown in FIG. 1B, the printed circuit substrate 1 including the electronic components 2–4 in its entirety is covered with a coating layer 14 to be hermetically sealed. For forming the coating layer 14, a silicone having high thermal resistance (for example, Article No. AX42-360, Dow Corning Toray Silicone Co., Ltd.) is used as a coating material, with which the whole printed circuit substrate 1 including the electronic components 2–4 is coated by dip method, and after that the silicone is set by heat at a rate of, for example, 150° C. ×30 min, so as to form the coating layer 14.

Figure 1C:
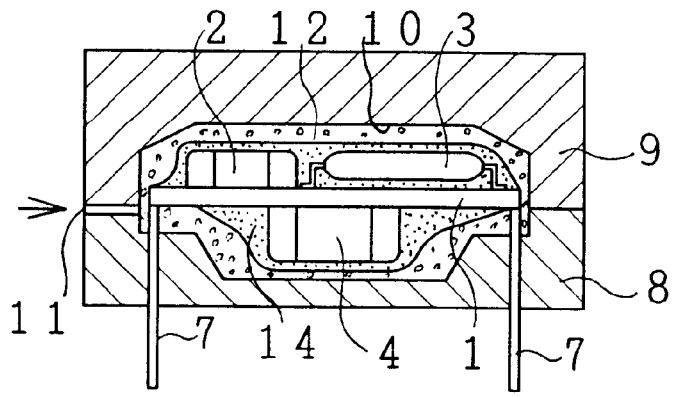

Next, as shown in FIG. 1C, the printed circuit substrate 1 which has been covered with the coating layer 14 is inserted into a cavity 10 formed by a lower mold 8 and an upper mold 9, after which the both molds 8, 9 are clamped together. Successively, a melted thermoplastic resin material 12 is injected into the cavity 10 through an injection orifice 11. As the thermoplastic resin 12, a crystal polymer such as Article No. CX-966, Nippon Petrochemicals Co., Ltd., may be preferably used. When employing such thermoplastic resin 12, the injection speed may be preferably set at 120 to 150 mm/sec, the resin temperature may be set in a range of 320 to 330° C., and the mold temperature may be set around 50° C.

Figure 1D:
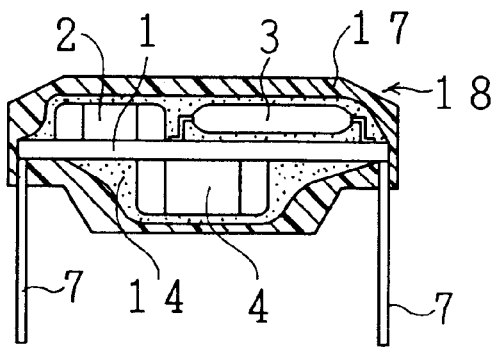
Figure 2A:
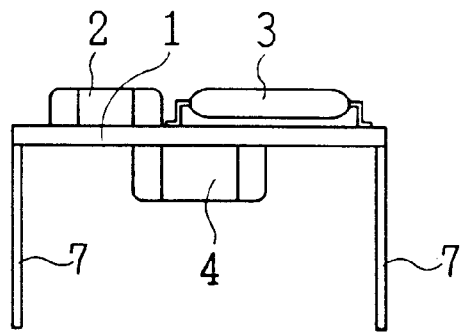
FIGS. 2A–2C are simplified cross-sectional views showing a conventional method for manufacturing a resin-encapsulated electronic product in order of process, respectively illustrating a mounting step (FIG. 2A), a package layer forming step (FIG. 2B), and a finished resin-encapsulated electronic product (FIG. 2C).
Figure 2B:
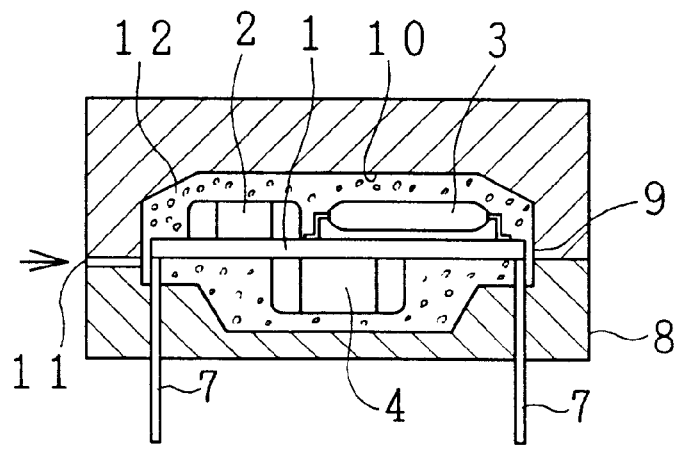
Figure 2C:
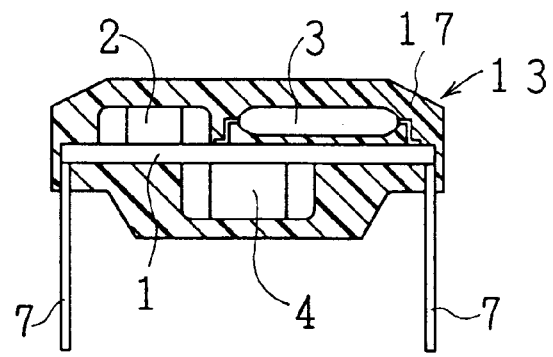

When the melted thermoplastic resin 12 is injected into the cavity 10, the electronic components 2–4, the printed circuit substrate 1, and the solder paste are all protected by the coating layer 14 which has a distinct heat-resisting property and thereby are prevented from being directly contacted with the melted thermoplastic resin 12. Accordingly, the electronic components 2–4 are prevented from being damaged by heat, since the heat stress exerted thereto is alleviated due to the coating layer 14 which blocks the heat conductance from the thermoplastic resin 12. Also, the shearing strain which is exerted on the electronic components 2–4 and the solder paste from the inflow of the thermoplastic resin 12 is remarkably reduced as compared with the case in which they are not covered with the coating layer 14 because they are fixed by the coating layer 14. Thus, it is avoided that the electronic components 2–4 are displaced or a part of the solder paste melts and flows away. Accordingly, highly favorable sealing in terms of functions and reliability can be achieved with the package layer 17 of the thermoplastic resin 12, and the yield of the finished resin-encapsulated electronic product 18 is remarkably enhanced. After the thermoplastic resin 12 has been set by being cooled, the molds 8, 9 are removed, resulting in a resin-encapsulated electronic product 18 which is covered with the package layer 17 and has a certain function as shown in FIG. 1D.

INDUSTRIAL APPLICABILITY

As set forth above, according to the present invention, a coating layer is preliminarily formed by which the entire substrate including electronic components is covered and sealed with a coating material having high heat resistance, and since a package layer of a thermoplastic resin is formed after that, the electronic components are prevented from being damaged by heat, as the printed circuit substrate and the solder paste are not directly contacted to the thermoplastic resin by the coating layer with a high heat-resisting property, and thus the heat stress exerted to the electronic component is lessened by this coating layer. Also, such defects that the electronic components are displaced or a part of the solder paste melts and flows away can be avoided because the shearing strain exerted to the electronic components and the solder paste from the inflow of the thermoplastic resin is remarkably reduced as compared with the case in which they are not covered with the coating layer. As a result, highly favorable sealing can be achieved in terms of functions and reliability thanks to the package layer, whereby the yield can be distinctly enhanced.

What is claimed is:

1. A method of manufacturing a resin-encapsulated electronic product, comprising the steps of:
    a component mounting step of mounting a plurality of components by soldering on a double-sided substrate on which a predetermined circuit pattern has been printed;
    a coating layer forming step of covering an entire surface of the substrate and mounted components with a protective coating layer of a coating material having high heat resistance; and
    a package layer forming step of encapsulating the substrate and mounted components covered with the coating layer with a thermoplastic resin material, wherein silicone and a crystal polymer are respectively used as the coating material and the thermoplastic resin material.

2. A method of manufacturing a resin-encapsulated electronic product according to claim 1 wherein the coating layer forming step includes dipping the double-sided substrate with the plurality of components into a coating material to hermetically seal the double-sided substrate with the plurality of components.

3. A method of manufacturing a resin-encapsulated electronic product according to claim 2 further including heating the coating layer to set it.

4. A method of manufacturing a resin-encapsulating electronic product according to claim 3 wherein the thermoplastic resin material is a liquid crystal polymer.

5. A method of manufacturing a resin-encapsulated electronic product according to claim 1 further including heating the coating layer to set it.

6. A method of manufacturing a resin-encapsulating electronic product according to claim 1 wherein the thermoplastic resin material is a liquid crystal polymer.

* * * * *